United States Patent
Ito

(10) Patent No.: US 7,456,705 B2
(45) Date of Patent: Nov. 25, 2008

(54) SURFACE ACOUSTIC WAVE DEVICE, DUPLEXER, AND COMMUNICATIONS EQUIPMENT

(75) Inventor: Motoki Ito, Kyoto (JP)

(73) Assignee: Kyocera Corporation, Kyoto (JP)

(*) Notice: Subject to any disclaimer, the term of this patent is extended or adjusted under 35 U.S.C. 154(b) by 303 days.

(21) Appl. No.: 11/361,685

(22) Filed: Feb. 24, 2006

(65) Prior Publication Data
US 2006/0186968 A1    Aug. 24, 2006

(30) Foreign Application Priority Data
Feb. 24, 2005    (JP) .............. 2005-049192

(51) Int. Cl.
H03H 9/72 (2006.01)
H03H 9/64 (2006.01)
(52) U.S. Cl. .................... 333/133; 333/193
(58) Field of Classification Search ........ 333/133, 333/193
See application file for complete search history.

(56) References Cited

U.S. PATENT DOCUMENTS

| | | | | |
|---|---|---|---|---|
| 5,654,680 A * | 8/1997 | Kwan et al. | ........ | 333/195 |
| 6,351,197 B1 * | 2/2002 | Selmeier et al. | ........ | 333/195 |
| 6,404,101 B1 * | 6/2002 | Taniguchi et al. | ........ | 310/313 A |
| 6,570,470 B2 * | 5/2003 | Maehara et al. | ........ | 333/193 |
| 6,717,487 B2 * | 4/2004 | Takata | ........ | 333/133 |
| 6,833,774 B2 * | 12/2004 | Abbott et al. | ........ | 333/193 |
| 6,946,931 B2 | 9/2005 | Inoue et al. | | |
| 2004/0227587 A1* | 11/2004 | Inoue et al. | ........ | 333/193 |

FOREIGN PATENT DOCUMENTS

| | | | |
|---|---|---|---|
| JP | 09-093072 | * | 4/1997 |
| JP | 10-313229 | | 11/1998 |
| JP | 2001-308671 | | 11/2001 |
| JP | 2003-198317 | | 7/2003 |

OTHER PUBLICATIONS

Patent Abstracts of Japan JP 02-295305, Dec. 6, 1990, Morimoto.*

* cited by examiner

Primary Examiner—Barbara Summons
(74) Attorney, Agent, or Firm—Hogan & Hartson LLP

(57) ABSTRACT

A SAW device D1 according to the present invention comprises a ladder-type SAW device T1 for transmission and a ladder-type SAW device R2 for receiving on a main surface of a piezoelectric substrate. The ratio (LT/PT) of the width LT of electrode fingers to the pitch PT between the electrode fingers in a SAW resonator S1 in the ladder-type SAW device T1 for transmission is made lower than the ratio (LR/PR) of the width LR of electrode fingers to the pitch PR between the electrode fingers in a SAW resonator S2 in the ladder-type SAW device R2 for receiving. As a result, the SAW device D1 has a low loss within a band and has steep attenuation characteristics outside the band, and is miniaturized.

12 Claims, 5 Drawing Sheets

SURFACE ACOUSTIC WAVE DEVICE, DUPLEXER, AND COMMUNICATIONS EQUIPMENT

BACKGROUND OF THE INVENTION

1. Field of the Invention

The present invention relates to a surface acoustic wave device (hereinafter referred to as a "SAW device"), a duplexer comprising the SAW device, and a communications equipment carrying the duplexer 2. Description of Related Art In recent years, as devices used for equipment utilizing radio waves, e.g., filters, delay lines, oscillators, etc. in communications equipment, SAW devices having features of being small in size and light in weight and having a steep cutoff performance as the filters have been frequently employed.

The SAW devices have been frequently used for filters in RF stages and IF stages of cellular phones, for example. The SAW devices have been also frequently used for duplexers that are circuits just below antennas.

The SAW devices are required to have low losses, have high attenuation characteristics outside pass bands, and have wide pass bands.

FIGS. 8 and 9 are graphs showing pass characteristics in a case where a SAW device is used as a filter in a duplexer that respectively pass through a transmission band and a receiving band. In this example, the frequency in the receiving band is higher than the frequency in the transmission band.

The attenuation in the pass band of the SAW device is referred to as an "insertion loss" or simply a "loss". Further, the attenuation characteristics of a signal outside the pass band is referred to as "attenuation characteristics". The amount of leakage of a signal in a transmission circuit into a receiving circuit is referred to as "isolation".

A duplexer is required to have a low insertion loss in the transmission band and is also required to have high isolation between the transmission side and the receiving side.

As one type of SAW device, a ladder-type SAW filter in which a plurality of SAW resonators are disposed on a piezoelectric substrate and connected in a ladder shape as a whole in series and in parallel with a signal line has been known.

The ladder-type SAW filter has started to be widely employed as SAW filters for transmission and receiving iii a duplexer such as a cellular phone because it is small in size, has a low loss, and has sleep attenuation characteristics.

In a case where the SAW device is employed for the duplexer, it has so far examined that the ratio (L/P) of the width L of electrode fingers in an Inter Digital Transducer (IDT) electrode in the SAW resonator to the pitch (period) P between the electrode fingers is set to more than 0.5 for the purpose of improving the precision of the formation process of the SAW device (see JP 2001-308671 A).

On the other hand, in order to obtain good steep attenuation characteristics, it has been assumed that the ratio (L/P) of the width L of electrode fingers in an IDT electrode in a SAW resonator to the pitch P between the electrode fingers may be set to less than 0.5 (see JP 2003-198317 A).

In technology disclosed in JP 2001-308671 A, however, the above-mentioned ratio L/P is set to more than 0.5 so that the width L of the electrode fingers is widened if the pitch P between the electrode fingers is fixed. Therefore, spacing (P-L) between the electrode fingers is narrowed. Thus, the static capacitance of the SAW resonator is increased. As a result, the insertion loss of the SAW device is increased.

Since the ladder-type transmission SAW device in the duplexer is required to have a lower loss in a transmission frequency band, the duplexer has a high loss in the technology disclosed in JP 2001-308671 A.

In technology disclosed in JP 2003-198317 A, the above-mentioned ratio L/P is set to less than 0.5 so that the width L of the electrode fingers is narrowed. Therefore, spacing (P-L) between the electrode fingers is widened. Thus, the static capacitance of the SAW resonator is reduced. As a result, the attenuation outside the pass band, i.e., isolation of the SAW device is reduced.

In the ladder-type SAW device for receiving in the duplexer, an improvement in attenuation characteristics in a transmission frequency band is indispensable in order to realize high isolation characteristics. In the technology disclosed in JP 2003-198317 A, the duplexer becomes inferior in isolation characteristics.

It is generally known that the number of pairs of electrode fingers in the SAW resonator and the cross width of the electrode fingers may be increased in order to make the insertion loss of the SAW device low and make the attenuation characteristics thereof steep.

As the number of pairs of the electrode fingers and the cross width of the electrode fingers increase, however, the size of the SAW resonator increases. Therefore, a request in a market to achieve miniaturization cannot be satisfied.

An object of the present invention is to provide a SAW device that is low in loss and high in attenuation while being miniaturized, a duplexer using the SAW device, and communications equipment using the duplexer.

SUMMARY OF THE INVENTION

A SAW device according to the present invention is a SAW device formed on a main surface or main surfaces of one or a plurality of piezoelectric substrates, comprising a ladder-type transmission SAW device comprising one or a plurality of SAW resonators for transmission connected in series with a transmission signal line and one or a plurality of SAW resonators for transmission connected in parallel with the transmission signal line; and a ladder-type receiving SAW device comprising one or a plurality of SAW resonators for receiving connected in series with a receiving signal line and one or a plurality of SAW resonators for receiving connected in parallel with the receiving signal line, the ratio (LT/PT) of the width LT of electrode fingers in an IDT electrode in at least one of the SAW resonators for transmission to the pitch PT between the adjacent electrode fingers in the IDT electrode and the ratio (LR/PR) of the width LR of electrode fingers in an IDT electrode in at least one of the SAW resonators for receiving to the pitch PR between the adjacent electrode fingers in the IDT electrode satisfy the following expression:

$$(LT/PT) < (LR/PR)$$

According to the SAW device having this configuration, the width L of the electrode fingers is relatively narrowed in any one of the SAW resonators for transmission by satisfying the foregoing expression. Therefore, spacing (P-L) between the electrode fingers can be widened. Thus, the static capacitance of the SAW resonator is reduced, and an extra parasitic capacitance generated in the SAW resonator can be reduced. As a result, low loss characteristics can be obtained in the ladder-type transmission SAW device.

On the other hand, the width L of the electrode fingers is relatively widened in any one of the SAW resonators for receiving. Therefore, spacing (P-L) between the electrode fingers can be narrowed. Thus, the static capacitance of the SAW resonator can be increased. As a result, a parasitic capacitance generated in the ladder-type SAW device for receiving can be increased. As a result, the ladder-type SAW device for receiving has high attenuation characteristics, so that high isolation characteristics can be obtained in the transmission band.

If the ratio (LT/PT) in any one of the SAW resonators for transmission connected in series with the transmission signal line and the ratio (LR/PR) in any one of the SAW resonators for receiving connected in parallel with the receiving signal line satisfy the foregoing expression, two requests, i.e., a low insertion loss and high isolation can be easily satisfied.

Furthermore, if the respective ratios (LT/PT) in all the SAW resonators for transmission connected in series and in parallel with the transmission signal line and the respective ratios (LR/PR) in all the SAW resonators for receiving connected in series and in parallel with the receiving signal line satisfy the foregoing expression, two requests, i.e., a low insertion loss and high isolation can be easily and reliably satisfied.

A SAW device that can be suitably employed for a small-sized duplexer can be obtained without increasing the size of a piezoelectric substrate required to form the SAW device.

It is preferable that the ratio (LT/PT) in at least one of the SAW resonators for transmission satisfies the following expression:

$$(LT/PT) < 0.6$$

According to this configuration, the effect of the parasitic capacitance generated in the transmission SAW resonator can be reduced, so that lower loss characteristics can be more easily obtained. Consequently, a SAW device having a lower loss and higher isolation characteristics can be obtained.

It is preferable that the ratio (LR/PR) in at least one of the SAW resonators for receiving satisfies the following expression:

$$0.6 < (LR/PR)$$

According to this configuration, a parasitic capacitance required for out-of-band attenuation generated in the receiving SAW resonator can be increased, so that higher attenuation characteristics can be more easily obtained.

When the ladder-type transmission SAW device and the ladder-type SAW device for receiving are respectively formed on the main surfaces of the different piezoelectric substrates, coupling between the ladder-type transmission SAW device and the ladder-type SAW device for receiving by a SAW that propagates on the surface of the piezoelectric substrate or a bulk wave that propagates within the piezoelectric substrate can be eliminated. Therefore, a SAW device, which can be suitably employed as a duplexer, superior in isolation characteristics can be obtained.

If the SAW device according to the present invention is used as a duplexer, the attenuation of a transmission signal is reduced, so that communications equipment having low power consumption can be configured. Since a transmission signal in the communications equipment is not returned as a receiving signal, the communications equipment can carry out high-quality communication having little receiving noise.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1:
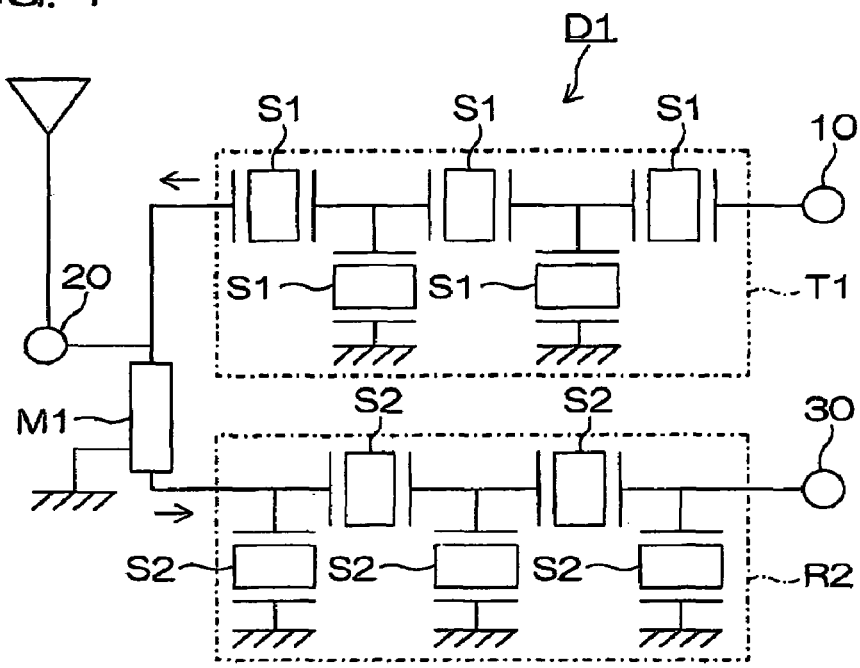
FIG. 1 is a circuit diagram showing an example of an embodiment of a SAW device according to the present invention.
Figure 2:
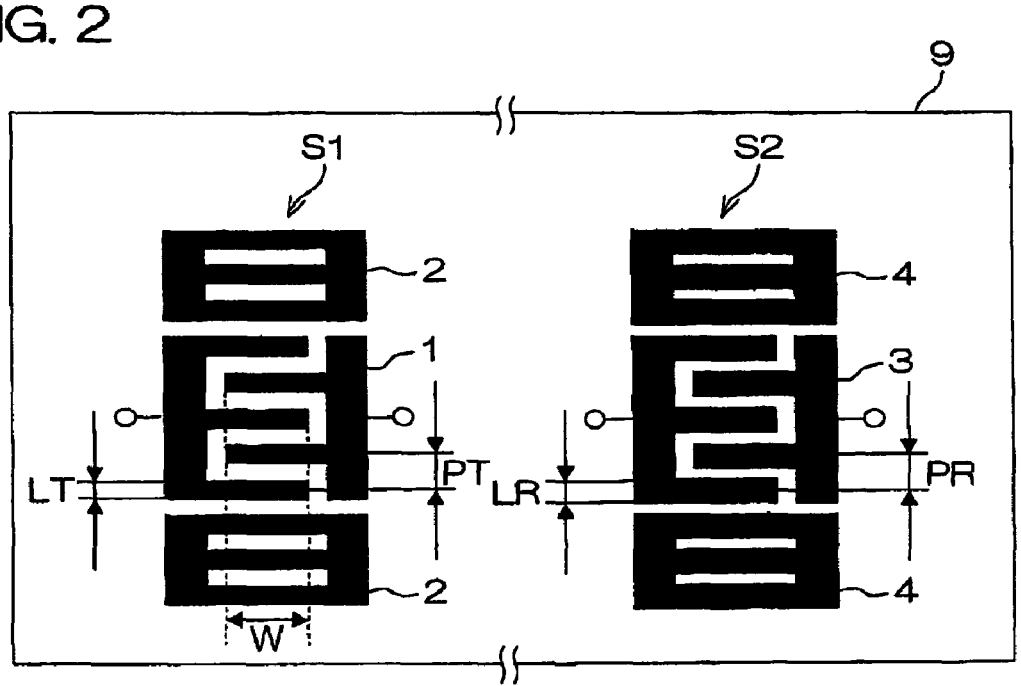
FIG. 2 is a schematic diagram showing an example of the pattern of IDT electrode fingers formed on a piezoelectric substrate 9.

FIG. 1 is a circuit diagram showing an example of a SAW device according to the present invention, and FIG. 2 is a diagram showing an example of the pattern of IDT electrode fingers in a SAW resonator. FIG. 2 is only a diagram schematically showing IDT electrode fingers. The shape and the number of pairs, for example, of IDT electrode fingers are not limited to those illustrated in FIG. 2.

As shown in FIG. 1., a SAW device D1 according to the present invention is employed as a duplexer, and comprises a ladder-type SAW device T1 for transmission and a ladder-type SAW device R2 for receiving.

In the following example, it is assumed that the frequency in the pass band of the ladder-type SAW device R2 for receiving is higher than the frequency in the pass band of the ladder-type SAW device T1 for transmission.

A plurality of SAW resonators S1 are connected in series and in parallel between a transmission input terminal 10 and an antenna terminal 20 in the SAW device D1, thereby constituting the ladder-type SAW device T1 for transmission.

A plurality of SAW resonators S2 are also connected in series and in parallel between the antenna terminal 20 and a receiving output terminal 30 in the SAW device D1, thereby constituting the ladder-type SAW device R2 for receiving.

A matching line M1 is added between the antenna terminal 20 and the ladder-type SAW device R2 for receiving. The matching line M1 is composed of an electrode pattern formed on a piezoelectric substrate 9. The matching line M1 may be formed on a case having the piezoelectric substrate 9 mounted thereon, a ceramic substrate, a ceramic laminated substrate, a substrate having the SAW device D1 mounted thereon, or the like.

Reactance components such as an inductance element and a capacitance element may be employed in place of the matching line M1.

The SAW resonators S1 and S2 are so configured that reflector electrodes 2 and 4 are respectively arranged on both sides of IDT (Inter Digital Transducer) electrodes 1 and 3 each formed in combination of pairs of IDT electrode fingers, as shown in FIG. 2, on a main surface of the piezoelectric substrate 9 composed of an $LiTaO_3$ single crystal, an $LiNbO_3$ single crystal, or the like.

Here, a line width ratio (LT/PT) that is the ratio of the width LT of the electrode fingers in the IDT electrode 1 to the pitch PT between the electrode fingers in the SAW resonator S1 in the ladder-type SAW resonator T1 for transmission, as shown in FIG. 2, is an important design parameter in improving the electrical characteristics of the SAW resonator S1.

On the other hand, a line width ratio (LR/PR) that is the ratio of the width LR of the electrode fingers in the IDT electrode 3 to the pitch PR between the electrode fingers in the SAW resonator S2 in the ladder-type SAW resonator R2 for receiving is also an important design parameter in improving the electrical characteristics of the SAW resonator S2.

The SAW device D1 is characterized in that the line width ratio (LT/PT) in any one of the SAW resonators S1 in the ladder-type SAW device T1 for transmission and the line width ratio (LR/PR) in any one of the SAW resonators S2 in the ladder-type SAW device R2 for receiving satisfy the following expression;

$$(LT/PT)<(LR/PR)$$

For example, the line width ratio (LT/PT) in the SAW resonator S1 closest to the transmission input terminal 10 in the ladder-type SAW device T1 for transmission is made lower than the line width ratio (LR/PR) in the SAW resonator S2 closest to the receiving output terminal 30 in The ladder-type SAW device R2 for receiving.

An extra parasitic capacitance generated in the ladder-type SAW device T1 for transmission can be reduced by making the line width ratio (LT/PT) in any one of the SAW resonators S1 lower than the line width ratio (LR/PR) in any one of the SAW resonators S2. Therefore, the ladder-type SAW device T1 for transmission can have low loss characteristics.

The attenuation of the ladder-type SAW device R2 for receiving greatly affects isolation characteristics in a transmission band of the SAW device D1.

For conventional products, in the ladder-type SAW device R2 for receiving, the line width ratio (LR/PR) is reduced, and a parasitic capacitance required for attenuation is also reduced, as in the ladder-type SAW device T1 for transmission. When the ladder-type SAW device T1 for transmission has a low loss, therefore, the ladder-type SAW device R2 for receiving also has low isolation characteristics.

In the SAW device D1 according to the present invention, however, the line width ratio (LR/PR) in any one of the SAW resonators S2 in the ladder-type SAW device R2 for receiving is made relatively higher than the line width ratio (LT/PT) in any one of the SAW resonators S1 in the ladder-type SAW device T1 for transmission. As a result, the parasitic capacitance, required to increase attenuation, generated in the ladder-type SAW device R2 for receiving can be increased, so that the ladder-type SAW device R2 for receiving can have high attenuation characteristics. Accordingly, high isolation characteristics can be obtained.

Particularly, it is effective for the ratio (LT/PT) in any one of the SAW resonator S1 connected in series in the ladder-type SAW device T1 for transmission and the ratio (LR/PR) in any one of the SAW resonators S2 connected in parallel in the ladder-type SAW device R2 for receiving to satisfy the following expression:

$$(LT/PT)<(LR/PR)$$

The reason for this will be described. Series SAW resonators in a ladder filter are designed at a higher frequency, as compared with parallel SAW resonators. Therefore, characteristics on the high frequency side of the pass band can be mainly controlled by designing the series SAW resonators. On the other hand, the parallel SAW resonators are designed at a lower frequency, as compared with the series SAW resonators. Therefore, the characteristics on the low frequency side of the pass band can be mainly controlled by designing the parallel SAW resonators. In a communication system in which a transmission band is arranged on the lower frequency side than a receiving band, the high frequency side of the transmission band is close to the receiving band, so that lower loss and higher attenuation characteristics are required. That is, it is important to design the series SAW resonators for transmission. On the other hand, the low frequency side of the receiving band is close to the transmission band, so that lower loss and higher attenuation characteristics are required. That is, it is important to design the parallel SAW resonators for receiving. As a result of the foregoing, it is effective for the series SAW resonators for transmission and the parallel SAW resonators for receiving to satisfy the foregoing expression.

Particularly, it is further effective for the ratios (LT/PT) in all the SAW resonators S1 for transmission connected in series and in parallel in the ladder-type SAW device T1 for transmission and the ratios (LR/PR) in all the SAW resonators S2 for receiving connected in series and in parallel in the ladder-type SAW device R2 for receiving to satisfy the foregoing expression.

Figure 3:
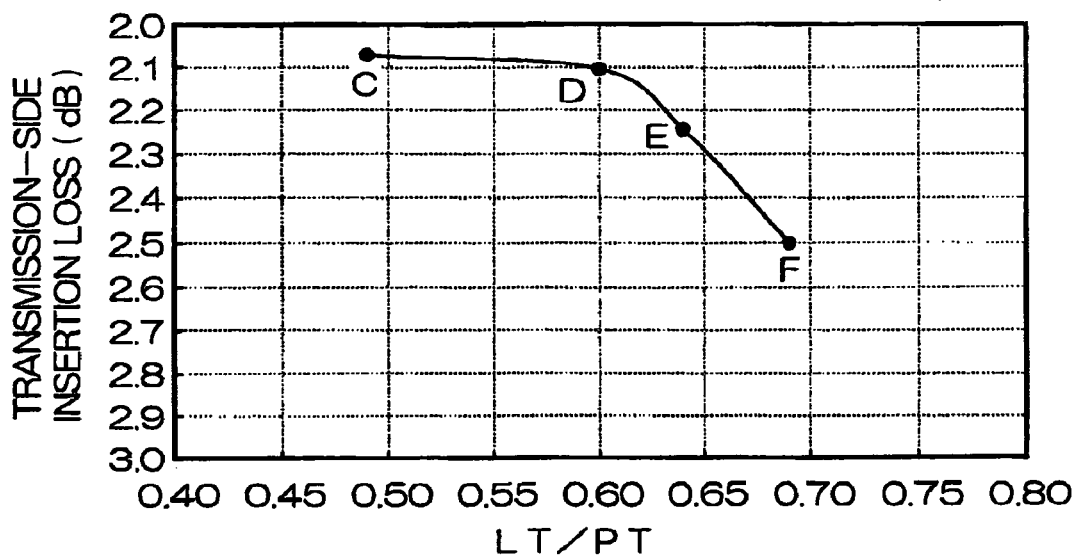
FIG. 3 is a graph showing the relationship between a line width ratio (LT/PT) in a ladder-type transmission SAW device in an example and the insertion loss thereof.

FIG. 3 is a graph showing the relationship between the line width ratio (LT/PT) and a transmission insertion loss in a case where all the resonators satisfy the foregoing expression.

It is found that the transmission insertion loss is rapidly increased when the line width ratio (LT/PT) exceeds 0.6, while being low and stable when it is less than 0.6.

The effect of the parasitic capacitance generated in the ladder-type SAW device T1 for transmission can be reliably eliminated by taking the line width ratio (LT/PT) in the SAW resonator S1 in the ladder-type SAW device T1 for transmission as one satisfying an expression (LT/PT)<0.6, so that more stable and lower loss characteristics can be obtained.

Figure 4:
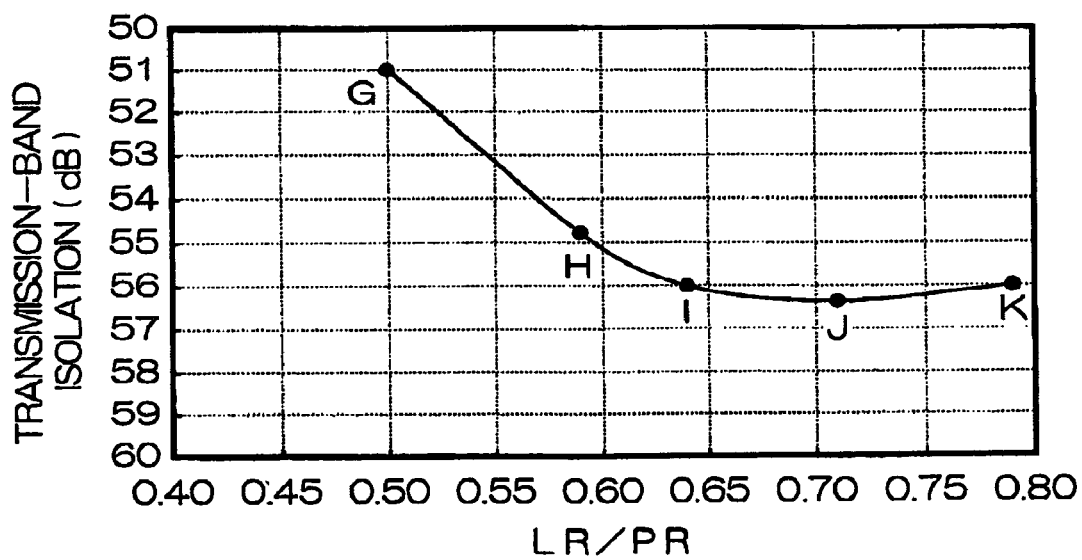
FIG. 4 is a graph showing the relationship between a line width ratio (LR/PR) in a ladder-type receiving SAW device in an example and the isolation characteristics thereof.

FIG. 4 is a graph showing the relationship between the line width ratio (LR/PR) and transmission-band isolation in a case where all the resonators satisfy the foregoing expression.

It is found that the transmission-band isolation is rapidly degraded when the line width ratio (LR/PR) is less than 0.6, while being high and stable when it exceeds 0.6.

Therefore, the parasitic capacitance, required to increase attenuation, generated in the ladder-type SAW device R2 for receiving can be increased by taking the line width ratio (LR/PR) in the SAW resonator S2 in the ladder-type SAW device R2 for receiving as one satisfying an expression 0.6<(LR/PR), so that higher attenuation characteristics can be more stably obtained.

Figure 5:
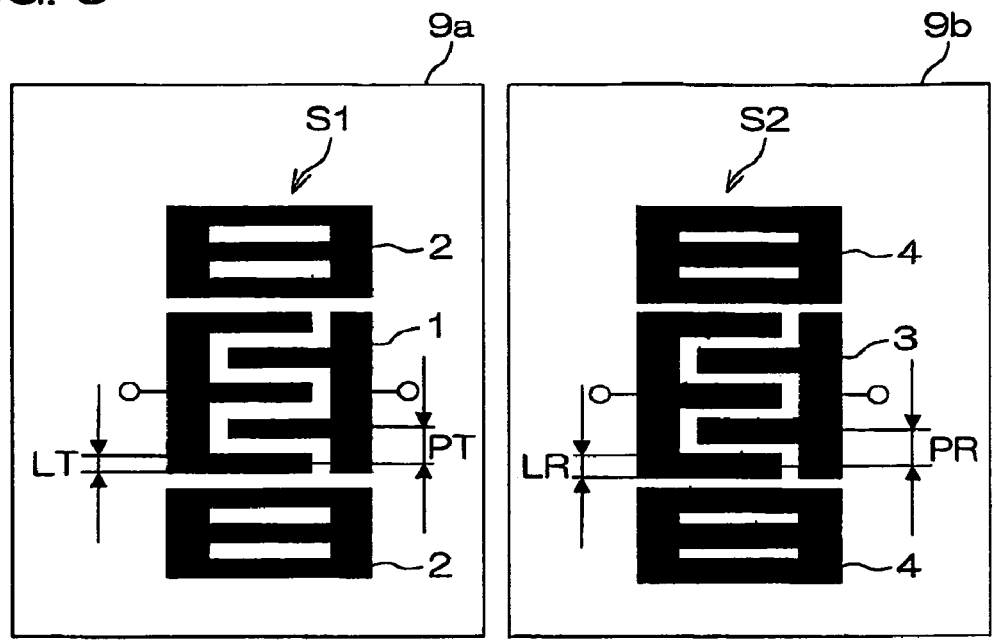
FIG. 5 is a schematic pattern view showing an example of IDT electrode fingers formed on piezoelectric substrates 9a and 9b.

FIG. 5 is a circuit diagram showing a more suitable example of the SAW device according to the present invention.

A SAW device D2 in this example is characterized in that a SAW resonator S1 in a ladder-type SAW device T1 for transmission and a SAW resonator S2 in a ladder-type SAW device R2 for receiving are respectively formed on main surfaces of different piezoelectric substrates 9a and 9b.

Isolation characteristics can be prevented from being degraded by coupling surface acoustic waves leaking between the SAW resonator S1 and the SAW resonator S2 by thus forming the SAW resonator S1 and the SAW resonator S2 on the main surfaces of the different piezoelectric substrates 9a and 9b.

Furthermore, the respective electrode patterns of the SAW resonator S1 and the SAW resonator S2 are separated between the different piezoelectric substrates 9a and 9b, so that the isolation characteristics can be prevented from being degraded by electric and magnetic coupling between the resonators.

The IDT electrodes in the SAW resonators S1 and S2 in the SAW device D1 according to the present invention may be formed of Al alloys such an Al, Al—Cu-based, Al—Ti-based, Al—Mg-based, and Al—Cu—Mg-based alloys and laminated films of different types of metals such as Al—Cu/Cu/Al—Cu, Ti/Al—Cu, and Ti/Al—Cu/Ti.

The IDT electrode may be formed by a thin film forming method such as an evaporation method, a sputtering method, or a CVD method.

It is appropriate in obtaining prescribed characteristics as the SAW resonators S1 and S2 or the SAW devices D1 and D2 that the number of pairs of IDT electrode fingers in the IDT electrode is approximately 50 to 300, the line width L of the electrode fingers is approximately 0.1 to 10 µm, the pitch P between the electrode fingers is approximately 0.1 to 10 µm, the opening width (the cross width) W of the electrode fingers is approximately 10 to 200 µm, and the thickness of the electrode fingers is approximately 0.1 to 0.5 µm.

As the piezoelectric substrate, a 36°±10° Y-cut X-propagation $LiTaO_3$ single crystal, a 64°±10° Y-cut X-propagation $LiNbO_3$ single crystal, a 45°±10° X-cut Z-propagation $Li_2B_4O_7$ single crystal, or the like is preferable because it has a high electromechanical coupling coefficient and a low group delay time temperature coefficient. Particularly, a 36°±10° Y-cut X-propagation $LiTaO_3$ single crystal having a high electromechanical coupling coefficient and hardly changing in characteristics by temperature is preferable. The thickness of the piezoelectric substrate is preferably approximately 0.1 to 0.5 mm. A piezoelectric substrate is made brittle when the thickness thereof is less than 0.1 mm, while increasing in material cost if it exceeds 0.5 mm.

In order to prevent electrode destruction by the pyroelectric effect of the piezoelectric substrate, the piezoelectric substrate may be subjected to reduction processing.

In order to prevent electrode destruction by the pyroelectric effect of the piezoelectric substrate, an Fe element may be added to the piezoelectric substrate.

Although it is desirable that the respective line width ratios (LT/PT) in the plurality of SAW resonators S1 composing the ladder-type SAW device T1 for transmission roughly coincide with one another, numerical values such as the number of electrode fingers, the cross width of the electrode fingers, and the pitch between the electrode fingers may be differentially designed.

Similarly, although it is desirable that the respective line width ratios (LR/PR) in the plurality of SAW resonators S2 composing the ladder-type SAW device R2 for receiving roughly coincide with one another, numerical values such as the number of electrode fingers, the cross width of the electrode fingers, and the pitch between the electrode fingers may be differentially designed.

The SAW device according to the present invention, can be applied to communications equipment.

That is, communications equipment comprising one or both of a receiving circuit and a transmission circuit can carry a band-pass filter or a duplexer using the SAW device according to the present invention.

The transmission circuit is a circuit for attenuating an unnecessary signal through the band-pass filter with a transmission signal on a carrier frequency by a mixer, then amplifying the transmission signal by a power amplifier, and transmitting the amplified transmission signal with an antenna through the duplexer.

The receiving circuit is a circuit for receiving a receiving signal with an antenna, amplifying the receiving signal that has passed through the duplexer by a low-noise amplifier, then attenuating an unnecessary signal through the band-pass filter, separating a signal from a carrier frequency by a mixer, and extracting the signal.

Communications equipment having superior characteristics can be realized by incorporating the duplexer or the band-pass filter thereinto.

EXAMPLES

Examples of manufacturing a SAW device according to the present invention will be described.

Lithium tantalate ($LiTaO_3$) was used for a piezoelectric substrate, a Ti thin film having a thickness of 6 nm was formed on its main surface, an Al—Cu thin film having a thickness of 130 nm was formed thereon, and three Ti thin films and three Al—Cu thin films were alternately laminated to form a Ti/Al—Cu laminated film of six layers in total.

A photoresist was then applied to a thickness of approximately 0.5 µm by a resist application device.

A photoresist pattern was formed stepper in such a manner that the line width ratio (LT/PT) of IDT electrode fingers in a SAW resonator S1 in a ladder-type SAW device T1 for transmission shown in FIG. 2 was lower than the line width ratio (LR/PR) of IDT electrode fingers in a SAW resonator S2 in a ladder-type SAW device R2 for receiving shown in FIG. 2.

The photoresist in an unnecessary portion was then dissolved using an alkali developing solution in a developing device, to form an electrode pattern by an RIE (Reactive Ion Etching) device.

A protective film was then formed on a predetermined region of the electrode pattern. That is, an $SiO_2$ film was formed to a thickness of approximately 0.02 µm on the electrode pattern and a main surface of a piezoelectric substrate by a CVD (Chemical Vapor Deposition) device.

The photoresist was then patterned by photolithography, to etch the protective film in electrode portion for flip-chip mounting by the RIE device or the like.

A sputtering device was then employed, to deposit a laminated electrode composed of Cr, Ni, and Au. The thickness of the electrode film at this time was set to approximately 1 µm.

The photoresist and the laminated electrode in the unnecessary portion were then simultaneously removed by a lift-off method, to form a pad for connecting flip-chip bumps.

The piezoelectric substrate was then subjected to dicing processing along a dicing line, and was divided for each chip of the SAW device.

An electrode pattern composed of a solder was then printed on a ceramic mounting substrate.

Each of the chips was then made to temporarily adhere on the ceramic mounting substrate with its electrode formation surface taken as its lower surface using a flip-chip mounting device.

The chip and the ceramic mounting substrate were made to adhere to each other by baking in an $N_2$ atmosphere to melt the solder.

Resin was then applied to the ceramic mounting substrate having the chip adhering thereon, followed by baking in an $N_2$ atmosphere, to resin-seal the chip.

The ceramic mounting substrate was then subjected to dicing processing along a dicing line, and was divided into pieces, to form a duplexer using the SAW device according to the present invention. Used as the ceramic mounting substrate divided into the pieces was one having a laminated structure measuring 2.5 by 2.0 mm.

On the other hand, a matching line M1 was composed of reactance components such as an inductance element and a capacitance element that were arranged on the ceramic mounting substrate having the SAW device mounted thereon.

As described in the foregoing, the SAW device A according to the present invention was formed. The respective line width ratios (LT/PT) in the SAW resonators S1 in the ladder-type SAW device T1 for transmission in the SAW device A were 0.60, and the respective line width ratios (LR/PR) in the SAW resonators S2 in the ladder-type SAW device R2 for receiving were 0.71.

As a comparative example, a conventional SAW device B was similarly formed by setting each of line width ratios (LT/PT) and (LR/PR) to 0.65 in the same film structure as described above.

The respective electrical characteristics of the SAW devices A and B were measured by a network analyzer device. The results thereof are shown in FIGS. 6 and 7.

Figure 6:
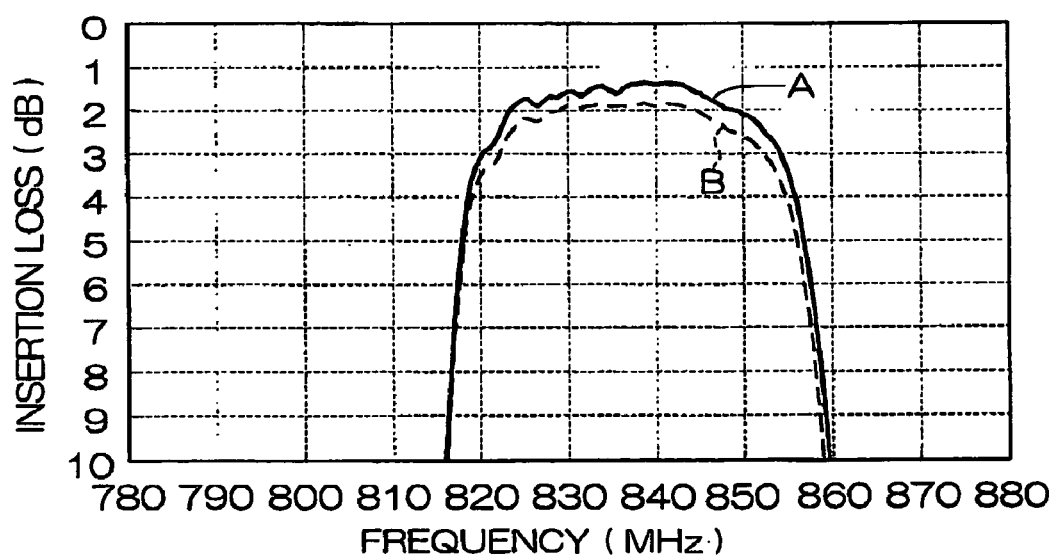
FIG. 6 is a graph showing the respective insertion losses of SAW devices in an example and a comparative example.

FIG. 6 is a graph showing the respective insertion losses of the SAW devices A and B, where the horizontal axis indicates a frequency (a unit: MHz) and the vertical axis indicates an insertion loss (a unit: dB). A solid characteristic curve indicates results in the SAW device A, and a broken characteristic curve indicates results in the SAW device B.

Figure 7:
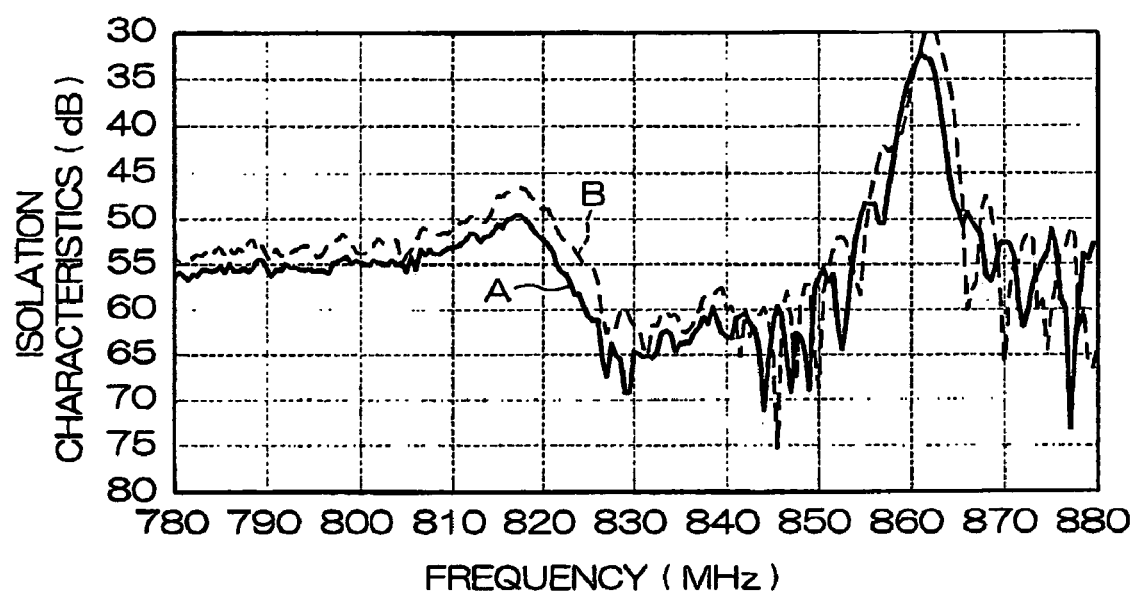
FIG. 7 is a graph showing the respective isolation characteristics of SAW devices in an example and a comparative example.
Figure 8:
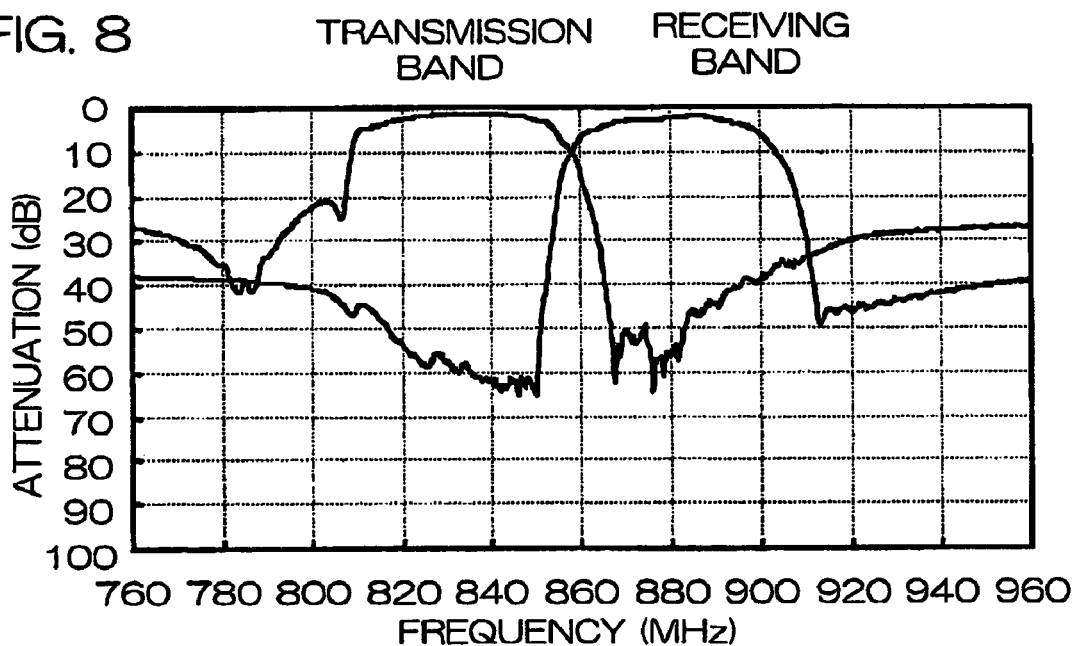
FIG. 8 is a graph for explaining the definition of an insertion loss.
Figure 9:
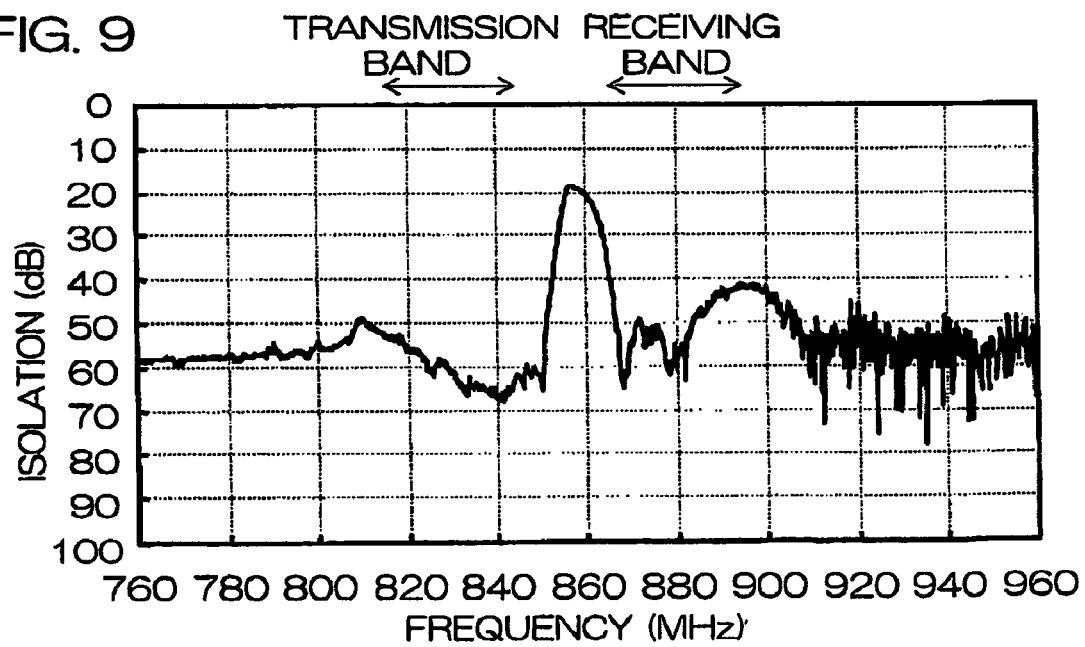
FIG. 9 is a graph for explaining the definition of isolation.

FIG. 7 is a graph showing the respective isolation characteristics of the SAW devices A and B, where the horizontal axis indicates a frequency (a unit: MHz) and the vertical axis indicates isolation characteristics (a unit: dB). A solid characteristic curve indicates results in the SAW device A, and a broken characteristic curve indicates results in the SAW device B.

As shown in FIGS. 6 and 7, the insertion loss was 2.0 dB and the isolation characteristics were 58 dB in the SAW device A in the example of the present invention, while the insertion loss was 2.4 dB and the isolation characteristics were 54 dB in the SAW device B in the comparative example. According to the example of the present invention, both the insertion loss and the isolation characteristics could be greatly improved.

SAW devices C, D, E, and F were formed by changing the line width ratio (LT/PT) in the SAW resonator S1 in the ladder-type SAW device T1 for transmission, as described below, in accordance with the pattern of the come-shaped electrode fingers shown in FIG. 2.

The line width ratios (LT/PT) and (LR/PR) in each of the SAW devices C, D, E, and F were as follows:

TABLE 1

| Line width ratio | C | D | E | F |
|---|---|---|---|---|
| (LT/PT) | 0.49 | 0.60 | 0.64 | 0.69 |
| (LR/PR) | 0.64 | 0.64 | 0.64 | 0.64 |

The respective electrical characteristics of the SAW devices C, D, E, and F in the examples were measured by the network analyzer device. The results of the measurement are shown graphically in FIG. 3.

In FIG. 3, the horizontal axis indicates a line width ratio (LT/PT), the vertical axis indicates a transmission insertion loss (a unit: dB), and solid circle plots and a characteristic curve indicate the relationship between the line width ratio (LT/PT) and the transmission insertion loss.

As shown in FIG. 3, the insertion loss increased as the line width ratio (LT/PT) in the SAW resonator S1 in the ladder-type SAW device T1 for transmission increased.

As can be seen from the results, in a case where the line width ratio (LT/PT) in the SAW resonator S1 in the ladder-type SAW device T1 for transmission was 0.6 or more (even if the line width ratio (LT/PT) in the SAW resonator S1 in the ladder-type SAW device T1 for transmission was lower than the line width ratio (LR/PR) in the SAW resonator S2 in the ladder-type SAW device R2 for receiving), the insertion loss was increased.

Accordingly, it is preferable that (LT/PT)<0.6.

Furthermore, SAW devices G, H, I, J, and K in examples were formed by changing the line width ratio (LR/PR) in the SAW resonator S2 in the ladder-type SAW device R2 for receiving, as described below, in accordance with the pattern of the IDT electrode fingers shown in FIG. 2.

The electrical characteristics of each of the SAW devices G, H, I, J, and K in the examples were similarly measured by the network analyzer device. The line width ratios (LT/Pr) and (LR/PR) in each of the SAW devices G, H, I, J, and K were as follows:

TABLE 2

| Line width ratio | G | H | I | J | K |
|---|---|---|---|---|---|
| (LT/PT) | 0.64 | 0.64 | 0.64 | 0.64 | 0.64 |
| (LR/PR) | 0.50 | 0.59 | 0.64 | 0.71 | 0.79 |

The respective electrical characteristics of the SAW devices G, H, I, J, and K in the examples were measured by the network analyzer device. The results of the measurement are shown graphically in FIG. 4.

In FIG. 4, the horizontal axis indicates a line width ratio (LR/PR), the vertical axis indicates transmission isolation (a unit: dB), and solid circle plots and a characteristic curve indicate the relationship between the line width ratio (LR/PR) and the transmission isolation.

As shown in FIG. 4, the transmission isolation increased as the line width ratio (LR/PR) in the SAW resonator S2 in the ladder-type SAW device R2 for receiving increased.

As can be seen from the results, in a case where the line width ratio (LR/PR) in the SAW resonator S2 in the ladder-type SAW device R2 for receiving was 0.6 or less (even if the line width ratio (LT/PT) in the SAW resonator S1 in the ladder-type SAW device T1 for transmission was lower than the line width ratio (LR/PR) in the SAW resonator S2 in the ladder-type SAW device R2 for receiving), the transmission isolation was decreased.

Accordingly, it is preferable that (LR/PR)>0.6.

The foregoing examples are illustrative of the embodiment of the present invention. The present invention is not limited to the same. The embodiment of the present invention may be varied and improved without departing from the scope of the present invention.

For example, the number of pairs of electrode fingers, the cross width thereof, etc. may be changed for each SAW resonator. In this case, it is possible to adjust the parasitic capacitance and control the SAW by changing the number of pairs of electrode fingers, the cross width thereof, etc. Therefore, lower loss and higher isolation characteristics can be obtained.

In the foregoing examples, it was assumed that the frequency in the pass band of the ladder-type SAW device R2 for receiving was higher than the frequency in the pass band of the ladder-type SAW device T1 for transmission. However, an inverse relationship, i.e., such a relationship that the frequency in the pass band of the ladder-type SAW device R2 for receiving was lower than the frequency in the pass band of the ladder-type SAW device T1 for transmission may hold. In this case, it is effective for SAW resonators connected in parallel on the transmission side and SAW resonators in series on the receiving side to satisfy the following expression;

$$(LT/PT)<(LR/PR)$$

The reason for this will be described. Series SAW resonators in a ladder filter are designed at a higher frequency, as compared with parallel SAW resonators. Therefore, characteristics on the high frequency side of the pass band can be mainly controlled by designing the series SAW resonators. On the other hand, the parallel SAW resonators are designed at a lower frequency, as compared with the series SAW resonators. Therefore, characteristics on the low frequency side of the pass band can be mainly controlled by designing the parallel SAW resonators. In a communication system in which a transmission band is arranged on the higher frequency side than a receiving band, the low frequency side of the transmission band is close to the receiving band, so that lower loss and higher attenuation characteristics are required. That is, it is important to design the parallel SAW resonators for transmission. On the other hand, the high frequency side of the receiving band is close to the transmission band, so that lower loss and higher attenuation characteristics are required. That is, it is important to design the series SAW resonators for receiving. As a result of the foregoing, it is effective for the parallel SAW resonators for transmission and the series SAW resonators for receiving to satisfy the foregoing expression.

The scope of the present invention also covers a configuration in which the configurations described in claims, as described below, are arbitrarily combined.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A SAW device formed on a main surface or main surfaces of one or a plurality of piezoelectric substrates, comprising:
   a ladder-type transmission SAW device comprising one or a plurality of transmission SAW resonators connected in series with a transmission signal line and one or a plurality of SAW resonators for transmission connected in parallel with the transmission signal line; and
   a ladder-line receiving SAW device comprising one or a plurality of SAW resonators for receiving connected in series with a receiving signal line and one or a plurality of receiving SAW resonators connected in parallel with the receiving signal line,
   wherein the ratio (LT/PT) of the width LT of electrode fingers in an IDT electrode in at least one of the transmission SAW resonators to the pitch PT between the adjacent electrode fingers in the IDT electrode, and the ratio (LR/PR) of the width LR of electrode fingers in an IDT electrode in at least one of the SAW resonators for receiving to the pitch PR between the adjacent electrode fingers in the IDT electrode satisfy the following expression:

$$(LT/PT)<(LR/PR)$$

and the respective pitches between the electrode fingers in the transmission SAW resonator connected in series with the transmission signal line and the receiving SAW resonator connected in parallel with the receiving signal line are substantially identical.

2. The SAW device according to claim 1, wherein the frequency in the pass band of the ladder-type SAW device for receiving is higher than the frequency in the pass band of the ladder-type transmission SAW device.

3. The SAW device according to claim 1, wherein the respective pitches P between the electrode fingers in the transmission SAW resonator and the receiving SAW resonator are substantially identical.

4. The SAW device according to claim 1, wherein the ratio (LT/PT) in at least one of the SAW resonators for transmission satisfies the following expression:

$$(LT/PT)<0.6.$$

5. The SAW device according to claim 1, wherein the ladder-type transmission SAW device and the ladder-type SAW device for receiving are respectively formed on the main surfaces of different ones of the plurality of piezoelectric substrates.

6. A duplexer using the transmission SAW device and receiving SAW device according to claim 1 as filters.

7. Communications equipment carrying the duplexer according to claim 6.

8. A SAW device formed on a main surface or main surfaces of one or a plurality of piezoelectric substrates, comprising:
   a ladder-type transmission SAW device comprising one or a plurality of transmission SAW resonators connected in series with a transmission signal line and one or a plurality of SAW resonators for transmission connected in parallel with the transmission signal line; and
   a ladder-type receiving SAW device comprising one or a plurality of SAW resonators for receiving connected in series with a receiving signal line and one or a plurality of receiving SAW resonators connected in parallel with the receiving signal line,
   wherein the ratio (LT/PT) of the width LT of electrode fingers in an IDT electrode in at least one of the transmission SAW resonators connected in series with the transmission signal line to the pitch PT between the adjacent electrode fingers in the IDT electrode, and the ratio (LR/PR) of the width LR of electrode fingers in an IDT electrode in at least one of the receiving SAW resonators connected in parallel with the receiving signal line to the pitch PR between the adjacent electrode fingers in the IDT electrode satisfy the following expression:

$$(LT/PT)<(LR/PR).$$

9. A SAW device formed on a main surface or main surfaces of one or a plurality of piezoelectric substrates, comprising:
   a ladder-type transmission SAW device comprising one or a plurality of transmission SAW resonators connected in series with a transmission signal line and one or a plurality of SAW resonators for transmission connected in parallel with the transmission signal line; and
   a ladder-type receiving SAW device comprising one or a plurality of SAW resonators for receiving connected in series with a receiving signal line and one or a plurality of receiving SAW resonators connected in parallel with the receiving signal line,
   wherein the ratio (LT/PT) of the width LT of electrode fingers in an IDT electrode in at least one of the transmission SAW resonators to the pitch PT between the adjacent electrode fingers in the IDT electrode, and the ratio (LR/PR) of the width LR of electrode fingers in an IDT electrode in at least one of the SAW resonators for receiving to the pitch PR between the adjacent electrode fingers in the IDT electrode satisfy the following expression:

(LT/PT)<(LR/PR)

and the ratio (LR/PR) in at least one of the SAW resonators for receiving satisfies the following expression:

0.6<(LR/PR).

10. A SAW device formed on a main surface or main surfaces of one or a plurality of piezoelectric substrates, comprising:
a ladder-type transmission SAW device comprising one or a plurality of transmission SAW resonators connected in series with a transmission signal line and one or a plurality of SAW resonators for transmission connected in parallel with the transmission signal line; and
a ladder-type receiving SAW device comprising one or a plurality of SAW resonators for receiving connected in series with a receiving signal line and one or a plurality of receiving SAW resonators connected in parallel with the receiving signal line,
wherein the ratio (LT/PT) of the width LT of electrode fingers in an IDT electrode in at least one of the transmission SAW resonators connected in parallel with the transmission signal line to the pitch PT between the adjacent electrode fingers in the IDT electrode, and the ratio (LR/PR) of the width LR of electrode fingers in an IDT electrode in at least one of the receiving SAW resonators connected in series with the transmission signal line to the pitch PR between the adjacent electrode fingers in the IDT electrode in the SAW resonator(s) for receiving satisfy the following expression:

(LT/PT)<(LR/PR).

11. A SAW device formed on a main surface or main surfaces of one or a plurality of piezoelectric substrates, comprising:
a ladder-type transmission SAW device comprising one or a plurality of transmission SAW resonators connected in series with a transmission signal line and one or a plurality of SAW resonators for transmission connected in parallel with the transmission signal line; and
a ladder-type receiving SAW device comprising one or a plurality of SAW resonators for receiving connected in series with a receiving signal line and one or a plurality of receiving SAW resonators connected in parallel with the receiving signal line,
wherein the ratio (LT/PT) of the width LT of electrode fingers in an IDT electrode in at least one of the transmission SAW resonators connected in series with the transmission signal line to the pitch PT between the adjacent electrode fingers in the IDT electrode, and the ratio (LR/PR) of the width LR of electrode fingers in an IDT electrode in at least one of the receiving SAW resonators connected in series with the transmission signal line to the pitch PR between the adjacent electrode fingers in the JDT electrode in the SAW resonator(s) for receiving satisfy the following expression:

(LT/PT)<(LR/PR)

and the ratio (LT/PT) of the width LT of electrode fingers in an IDT electrode in at least one of the transmission SAW resonators connected in parallel with the transmission signal line to the pitch PT between the adjacent electrode fingers in the IDT electrode, and the ratio (LR/PR) of the width LR of electrode fingers in an IDT electrode in at least one of the receiving SAW resonators connected in parallel with the transmission signal line to the pitch PR between the adjacent electrode fingers in the IDT electrode in the SAW resonator(s) for receiving satisfy the following expression:

(LT/PT)<(LR/PR).

12. The SAW device according to claim 11, wherein
the respective ratios (LT/PT) in all the SAW resonators for transmission connected in series and in parallel with the transmission signal line and the respective ratios (LR/PR) in all the SAW resonators for receiving connected in series and in parallel with the receiving signal line satisfy the foregoing expression.

* * * * *